US007287231B2

(12) United States Patent
Reichenthal et al.

(10) Patent No.: US 7,287,231 B2
(45) Date of Patent: Oct. 23, 2007

(54) LOGISTICS SIMULATOR

(75) Inventors: Steven W. Reichenthal, Yorba Linda, CA (US); Thomas A. Billig, St. Peters, MO (US); Jack S. Stewart, O'Fallon, MO (US)

(73) Assignee: The Boeing Company, Chicago, IL (US)

( * ) Notice: Subject to any disclaimer, the term of this patent is extended or adjusted under 35 U.S.C. 154(b) by 890 days.

(21) Appl. No.: 10/633,235

(22) Filed: Jul. 31, 2003

(65) Prior Publication Data

US 2005/0060131 A1  Mar. 17, 2005

(51) Int. Cl.
G06F 3/048 (2006.01)
G06F 3/01 (2006.01)

(52) U.S. Cl. ............................ 715/764; 703/6; 703/8; 703/22; 434/23

(58) Field of Classification Search ................ 715/762; 434/23; 703/2, 6, 8, 22
See application file for complete search history.

(56) References Cited

U.S. PATENT DOCUMENTS

| 5,794,128 | A  | * | 8/1998 | Brockel et al. | .......... | 455/67.11 |
| 5,910,903 | A  | * | 6/1999 | Feinberg et al. | ................ | 703/6 |
| 6,937,968 | B1 | * | 8/2005 | Carrico et al. | ................. | 703/8 |
| 6,945,780 | B2 | * | 9/2005 | Perry | .......................... | 434/11 |
| 6,997,715 | B2 | * | 2/2006 | Perry et al. | .................... | 434/11 |
| 7,149,679 | B2 | * | 12/2006 | Woodring | .................... | 703/22 |
| 2002/0049667 | A1 | * | 4/2002 | Navani et al. | ................. | 705/37 |
| 2002/0067373 | A1 | * | 6/2002 | Roe et al. | ..................... | 345/762 |
| 2002/0133456 | A1 | * | 9/2002 | Lancaster et al. | ............. | 705/37 |
| 2002/0142267 | A1 | * | 10/2002 | Perry | .......................... | 434/11 |

OTHER PUBLICATIONS

Sinex, Charles et al. "Linking Warfighting and Logistics" 2000 http://www.jhuapl.edu/techdigest/td2102/sinex.pdf.*
Bolling Robert H. et al "The Joint Theater Level Simulation in Military Operations Other than War" Aug. 1995.*
Whatmore LC et al "Simulation of modern electronic combat scenarios by means of a flexible generic model" Jan. 1991.*

* cited by examiner

Primary Examiner—Weilun Lo
Assistant Examiner—Steven B. Theriault
(74) Attorney, Agent, or Firm—Lee & Hayes, PLLC

(57) ABSTRACT

A graphical user interface devices, methods, and systems for creating and editing a simulation model and for presenting the simulation model simulated within a scenario are provided. The device includes a first component that allows a user to enter and edit platforms and associated attributes for the simulation model. Commodities can be entered, edited via a second component, or assigned to a platform via a third component. A directory structure includes an organizational units and platform directory structures. The platform directory structures store platform information based on platform type. Platforms, commodities, or scenario aspects can be reviewed and edited using a graphical user interface. The present invention provides an output for allowing a user to view commodity usage at any desired aspect of the simulation model. The simulation model is created using a simulation reference modeling language.

48 Claims, 9 Drawing Sheets

LOGISTICS SIMULATOR

FIELD OF THE INVENTION

The present invention relates generally to computer-implemented simulation systems and methods, and more particularly to logistic simulation systems, methods, and graphical user interfaces.

BACKGROUND OF THE INVENTION

Simulation is a process that attempts to predict aspects of the behavior of a system by creating an approximate, typically mathematical, model of the system. Computers provide an ideal environment for building simulations.

Simulators have many uses. For example, businesses use simulations to develop optimized processes such as staffing decisions or inventory management. Simulations also lower the risks associated with critical decisions by enabling analysis of influences to a system output. Engineers also use simulations to prototype and test designs.

However, simulations require an investment in tools, time, and people. Simulation tools can include spreadsheets, programming languages, and full-featured commercial simulation packages. Each of the currently available simulation tools have associated tradeoffs. Spreadsheets, for example, offer low purchase cost, but limited built-in functionality. Similarly, traditional programming languages provide maximum flexibility, but can require much time and skill to maintain and operate.

Both spreadsheets and programming languages can require extensive programming, and spreadsheets can be too slow for complex situation modeling where thousands of items are required to be simulated. General-purpose commercial simulation tools provide sophisticated built-in capabilities combined with graphical development environments, which may save time, but can also be very expensive. The initial price of general-purpose commercial simulation tools and/or licenses for such tools can run into tens of thousands of dollars per year. Such commercial simulation tools exist for specific applications such as supply chain management, resource management, manufacturing, and science.

All of these simulation tools have additional drawbacks. For instance, tool vendors can go out of business or be purchased by larger firms who significantly modify or discontinue a product line. The simulation tools may also not scale to handle highly sophisticated business processes. In addition, the programming languages underlying the tools can be obscure enough that the learning curve becomes high, and only a few people within a given organization become skilled in their use. Another drawback to currently available simulation tools is that there are no widely adopted standards for interchanging simulations developed in different tools, making it difficult to reuse the same simulation models.

Conventional simulation tools that support parallel processing or distribution are often not general-purpose, are very expensive, or require extremely advance programming in order to realize their potential. Further, without simulation support software, simulations developed in programming languages can lead to awkward programming. Even with a simulation engine, programming language solutions do not usually provide a natural way of describing hundreds or thousands of inter-connected objects of various types. Using traditional database management systems to store objects typically leads to simulations that run too slowly for practical use.

Simulations also inherently pose computing challenges. For example, simulations typically need to represent large numbers of inter-related objects in relationship to each other, and need to manipulate these objects at high speeds. Thus, unlike a traditional business program, a simulation may require a large amount of computing speed and memory. Due to the iterative process of simulation, modelers and other users need a way to easily repeat a simulation run with varying random number seeds and must be able to combine the results. Likewise, modelers need the ability to repeat simulation runs while systematically varying one or more parameters. Users of simulations also desire the ability to watch, freeze, reverse, and snapshot a simulation.

Thus, there exists a need for a low cost, easy to program, platform-independent, reusable, standards-based, and graphics-based simulation system and method.

SUMMARY OF THE INVENTION

A graphical user interface devices, methods, and systems for creating and editing a simulation model and for presenting the simulation model that is simulated within a scenario are provided. In one embodiment, the graphical user interface device allows a user to easily change a simulation model and review various results of an executed simulation model.

The device includes a first component that allows a user to enter and edit platforms and associated attributes. The platforms are determined to be included within the simulation model. A second component allows a user to enter and edit commodities and a third component allows a user to assign or remove a commodity to or from a platform. A directory structure includes a plurality of organizational units and platform directory structures. Each organizational unit is associated with a platform determined to be included within the model to be simulated. The platform directory structures store platform information based on platform type.

In one aspect of the invention, a fourth component allows a user to create and edit a scenario and to add, delete, or view a pulse associated with the scenario. In another aspect of the invention, the fourth component allows a user to add or delete a platform to or from a pulse. In a further aspect of the invention, the fourth component allows a user to add, delete, or view a segment associated with a pulse.

In still another aspect of the invention, the first component allows a user to define or edit attributes of a platform based on at least one of a segment or a pulse.

In still a further aspect of the invention, a commodities output area allows a user to present commodity usage information. The commodities output area includes a commodities usage list configured to present commodity usage information of a platform, group of platforms, or organizational unit selected in the directory structure. The commodities output area includes a graph for presenting commodity usage over time based on one of the selected operational unit, platform, or group of platforms from the directory structure and a commodity selected from the commodities output area.

In yet another aspect of the invention, the simulation model is created using a simulation reference modeling language.

BRIEF DESCRIPTION OF THE DRAWINGS

The preferred and alternative embodiments of the present invention are described in detail below with reference to the following drawings.

DETAILED DESCRIPTION OF THE INVENTION

Figure 1:
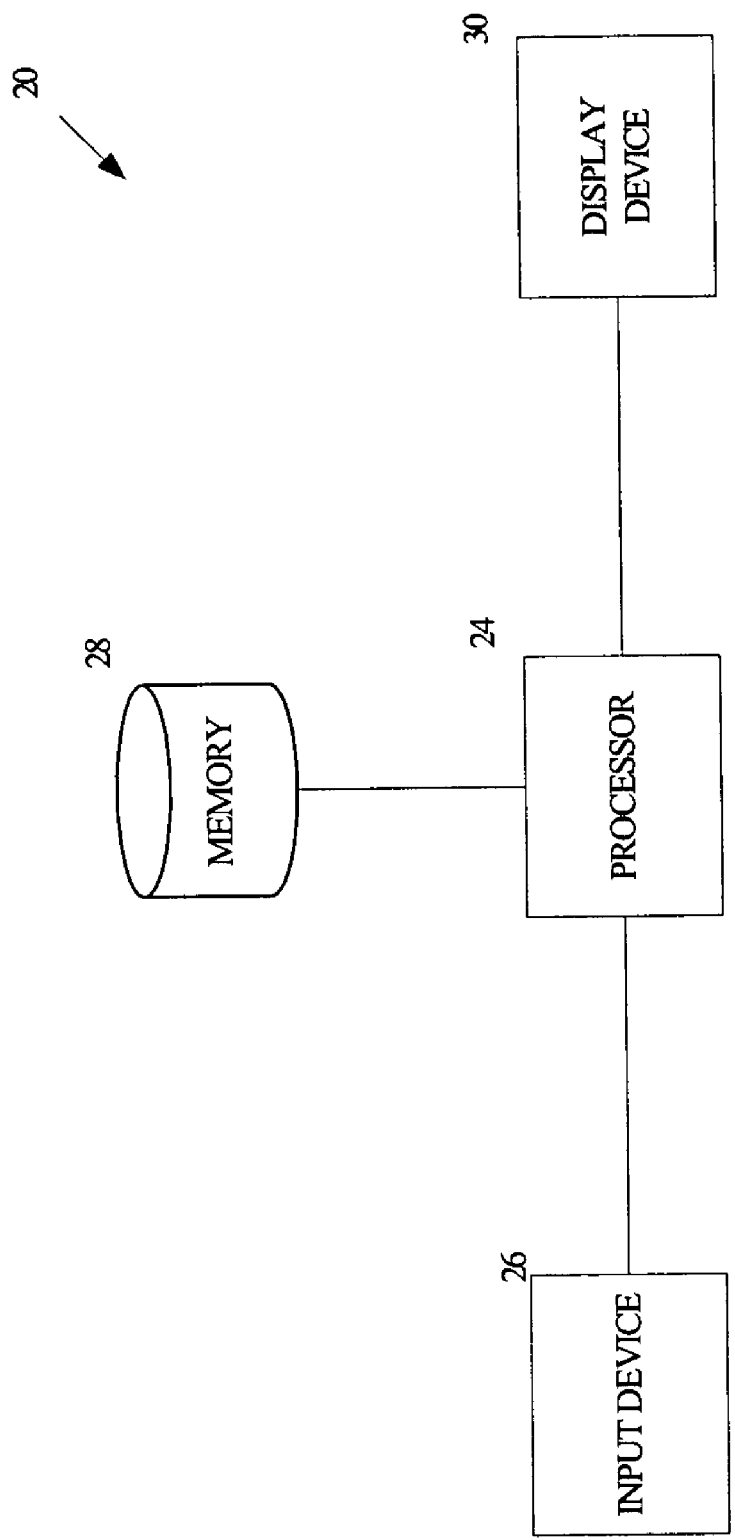
FIG. 1 illustrates a block diagram of an exemplary computer based system for executing software formed in accordance with the present invention.

FIG. 1 illustrates a general purpose computer 20 for running simulation operations and generating graphical user interfaces allowing users to interpret output of the simulation operations. The system 20 includes a processor 24 in wired or wireless communication with an input device 26, memory 28, and a display device 30. The input device 26 includes a user interface, such as a keyboard, mouse, touch screen, or other types of input devices that allow interaction with a graphical user interface application program. It will be appreciated that the components of the system 20 may be distributed over a network and that multiple computer-based systems may be coupled to the system 20 over a public or private data network.

Figure 2:
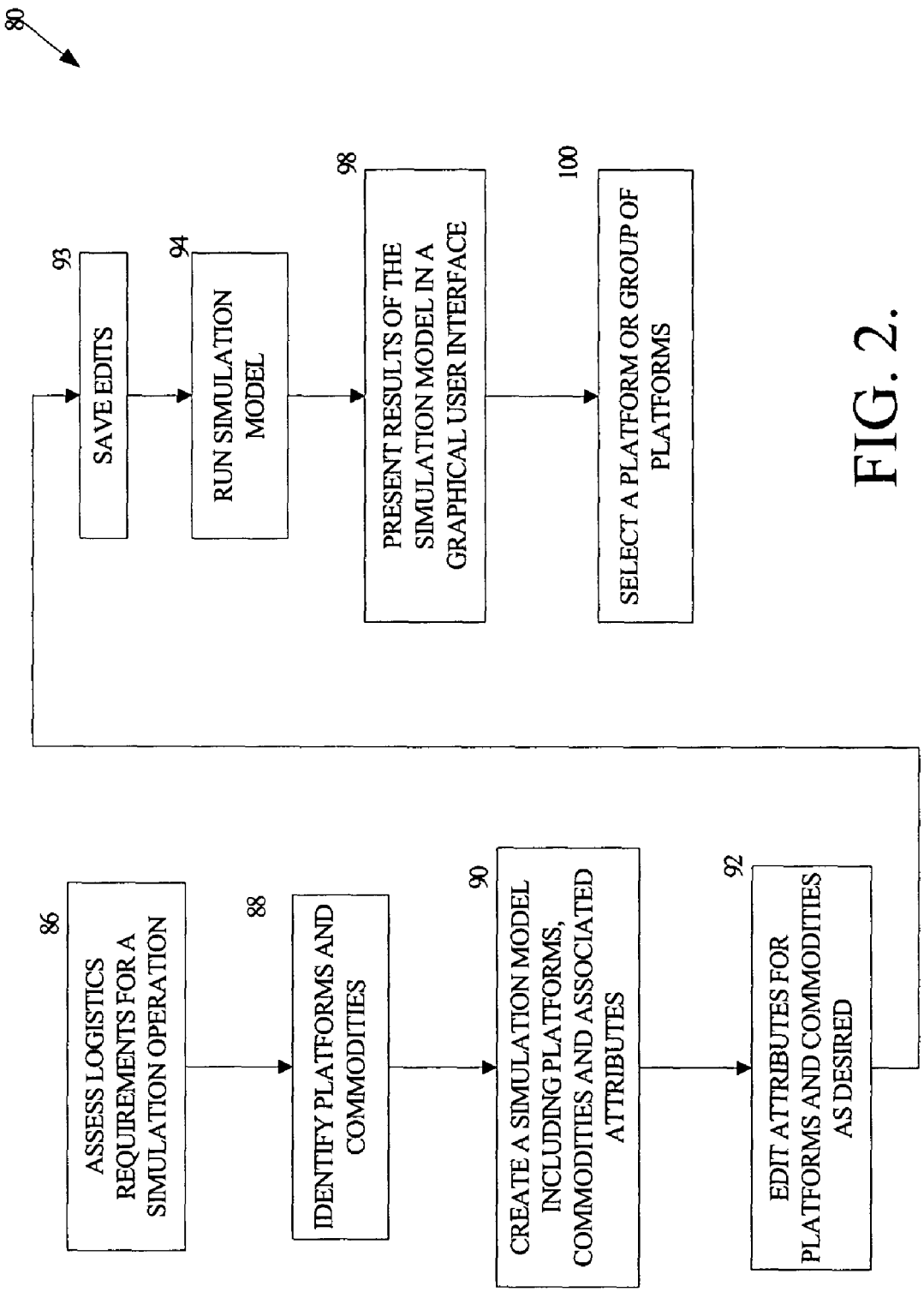
FIG. 2 illustrates a flow diagram of an exemplary process performed by the software executed by the system shown in FIG. 1.

Referring now to FIG. 2, an exemplary process 80 is performed by a simulation application program executed by the system 20 (FIG. 1). At a block 86, a user assesses logistics requirements for a simulation operation. At a block 88, the user identifies all changeable and nonchangeable platforms and commodities included within the assessed simulation operation. Commodities may be any expendable supply or concept. The logistics requirements include operational events that use the platforms in various ways.

At a block 90, a simulation model is created based on the assessed logistic requirements and the identified platforms and commodities. The user (i.e., a simulation model creator) generates the simulation model using a simulation programming language, such as that described in co-pending U.S. patent application Ser. No. 09/865,293, filed May 25, 2001, titled Simulation System and Method, the contents of which are hereby incorporated by reference. The generated simulation model includes initial values and quantities associated with the changeable platforms and quantities. The initial values and quantities are determined by the simulation model creator according to the assessed logistics requirements.

At a block 92, an end user reviews and edits, as desired, quantities or other values (attributes) associated with the changeable platforms and commodities. For example, a truck is a platform and miles per gallon and payload carrying capabilities are attributes of the truck. An end user (i.e., person running the simulation model and reviewing the results) may change the miles per gallon, if the truck platform is replaced with a more efficient truck. At a block 93, any edits are saved in the memory 28.

At a block 94, the simulation model is executed. At a block 98, the user interface presents the results of the executed simulation model on the display device 30. At a block 100, the user selects a platform or group of platforms for viewing associated results. The results present commodities usage over the period of time of the executed simulation model (i.e., the simulation).

Figure 3:
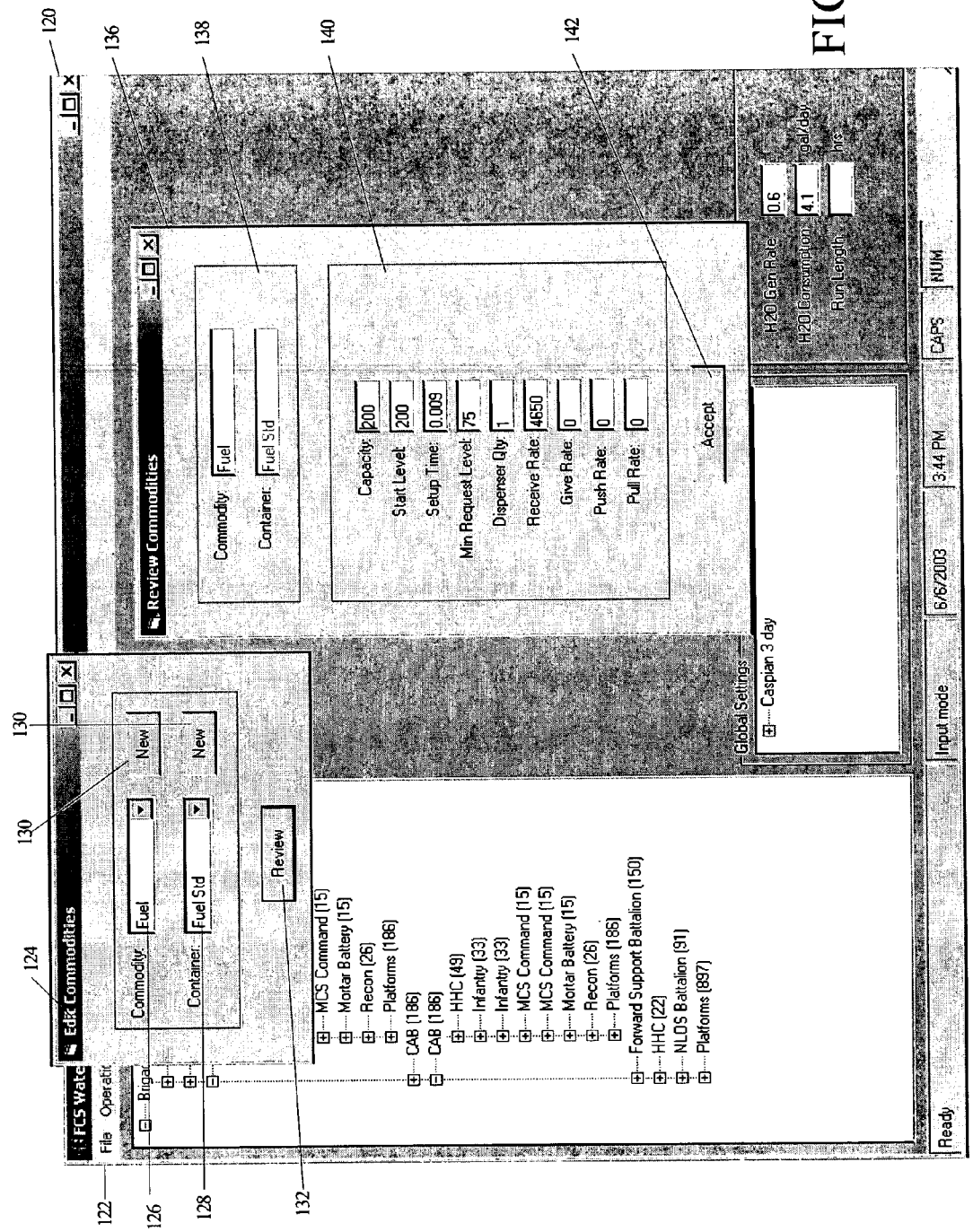
FIGS. 3-9 are graphical user interfaces generated by the software executed on the system shown in FIG. 1.

FIG. 3 illustrates an example simulation application graphical user interface window produced by a windows-based application program 120 for allowing a user to enter desired platform and commodity values prior to running a simulation model within a scenario. In this example the scenario is titled Caspian 3-day, which represents a 72 hour military combat mission. All platforms of the simulation model perform according to the scenario.

The window 120 is suitably produced in the windows based operating system. The window 120 includes a set of pull-down menus 122.

In order to edit attributes of commodities, a commodities function is selected from the pull-down menus 122, which presents an edit commodities window 124. The edit commodities window 124 includes a pull-down commodity field 126 that allows a user to select from previously defined commodities. The edit commodities window 124 also includes a pull-down container field 128 that allows the user to select from predefined containers associated with the commodity presented in the commodity field 126. Adjacent to each of the fields 126 and 128 are New buttons 130. Upon selecting a respective New button 130, the user can add a new commodity or new container into the simulation model.

The edit commodities window 124 also includes a review button 132 that, when selected, presents a review commodities window 136. The review commodities window 136 includes a commodity and container section 138 that presents the commodity and container that are presented in the edit commodities window 124. The review commodities window 136 also includes an attribute section 140 that presents all the changeable attributes that are associated with the displayed commodity and container presented in the commodity and container section 138. The attribute section 140 presents just changeable attributes, but may also present non-changeable attributes in order to show a user other attributes associated with a commodity and container. The review commodities window 136 also includes an Accept button 142 that, when selected, accepts all the values that have been presented or changed within the fields of the attribute section 140.

Figure 4:
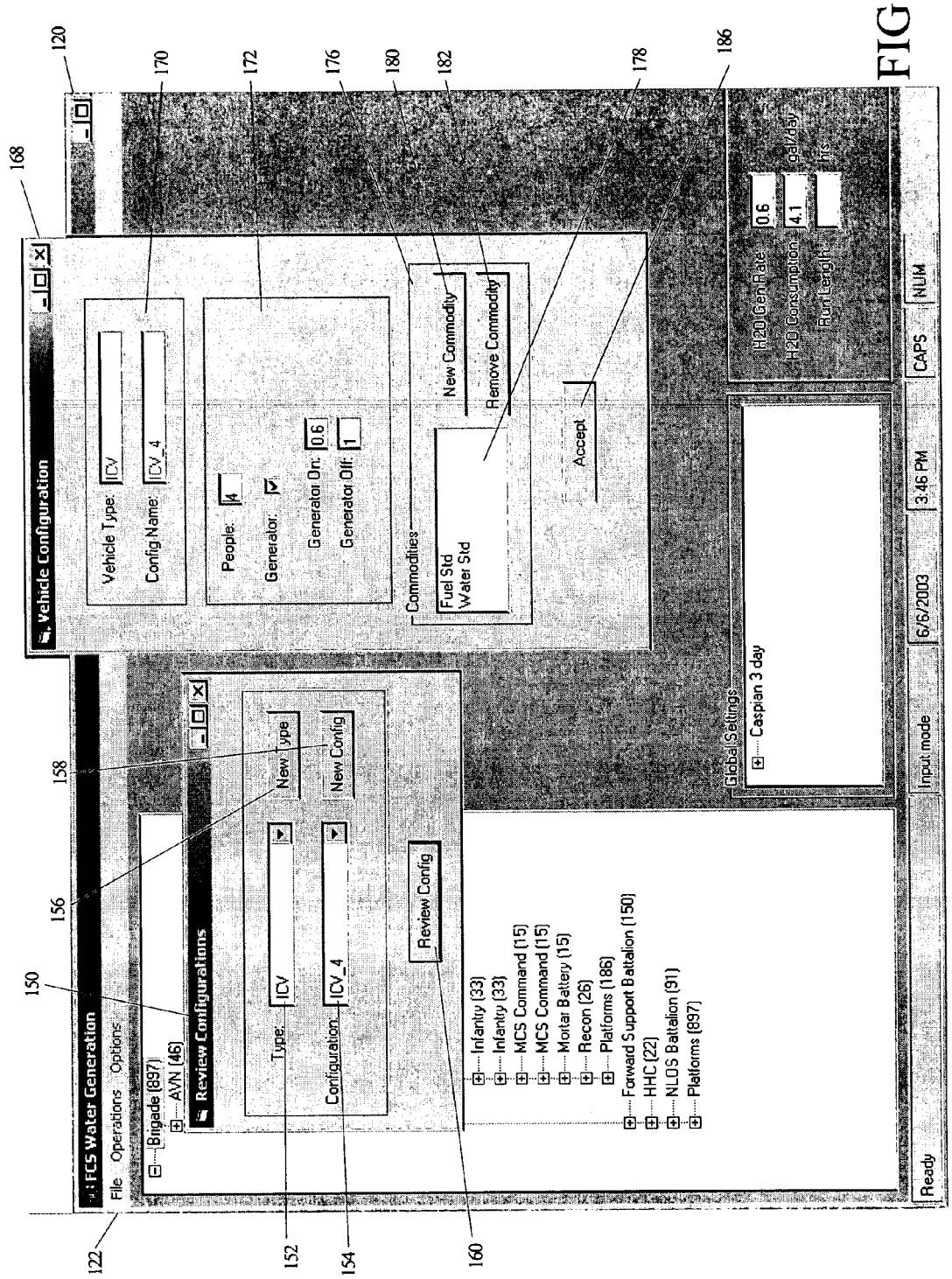

Referring now to FIG. 4, a review configurations window 150 is presented upon selection of the review configurations command presented in the pull-down menus 122 or as accessible by another interface associated with the window 120. The review configurations window 150 includes a platform type pull-down field 152 that allows a user to select from pre-defined platforms. A New Type button 156 is located adjacent to the field 152 that, when selected, allows the user to enter a new platform type. Located below the field 152 is a platform configuration pull-down field 154 that allows a user to select from previously defined configurations of the platform type presented in the field 152. Adjacent to the field 154 is a New Config (configuration) button 158 that when selected allows the user to enter a new configuration for the platform presented in the field 152. The review configurations window 150 also includes a Review Config (configuration) button 160 that, when activated, presents a detailed configurations window 168.

The detailed configuration window 168 includes a platform section 170, a detail section 172, an associated commodities section 176, and an accept button 186. The platform section 170 presents the platform type and configuration name identified in the review configurations window 150. The detail section 172 presents changeable attributes of the platform. The commodities section 176 includes a presentation window 178 that presents all the commodities associated with the platform identified in the platform section 170. The commodities section 176 also includes a New Commodity button 180 that when activated allows a user to associate a new commodity with the identified platform. A Remove Commodity button 182 is also included within the commodities section 176. The Remove Commodity button 182, when selected, removes a commodity that is highlighted or called out within the presentation window 178. When the Accept button 186 is activated all the values indicated within the sections of the detailed configuration window 168 are accepted and stored within the simulation model.

Figure 5:
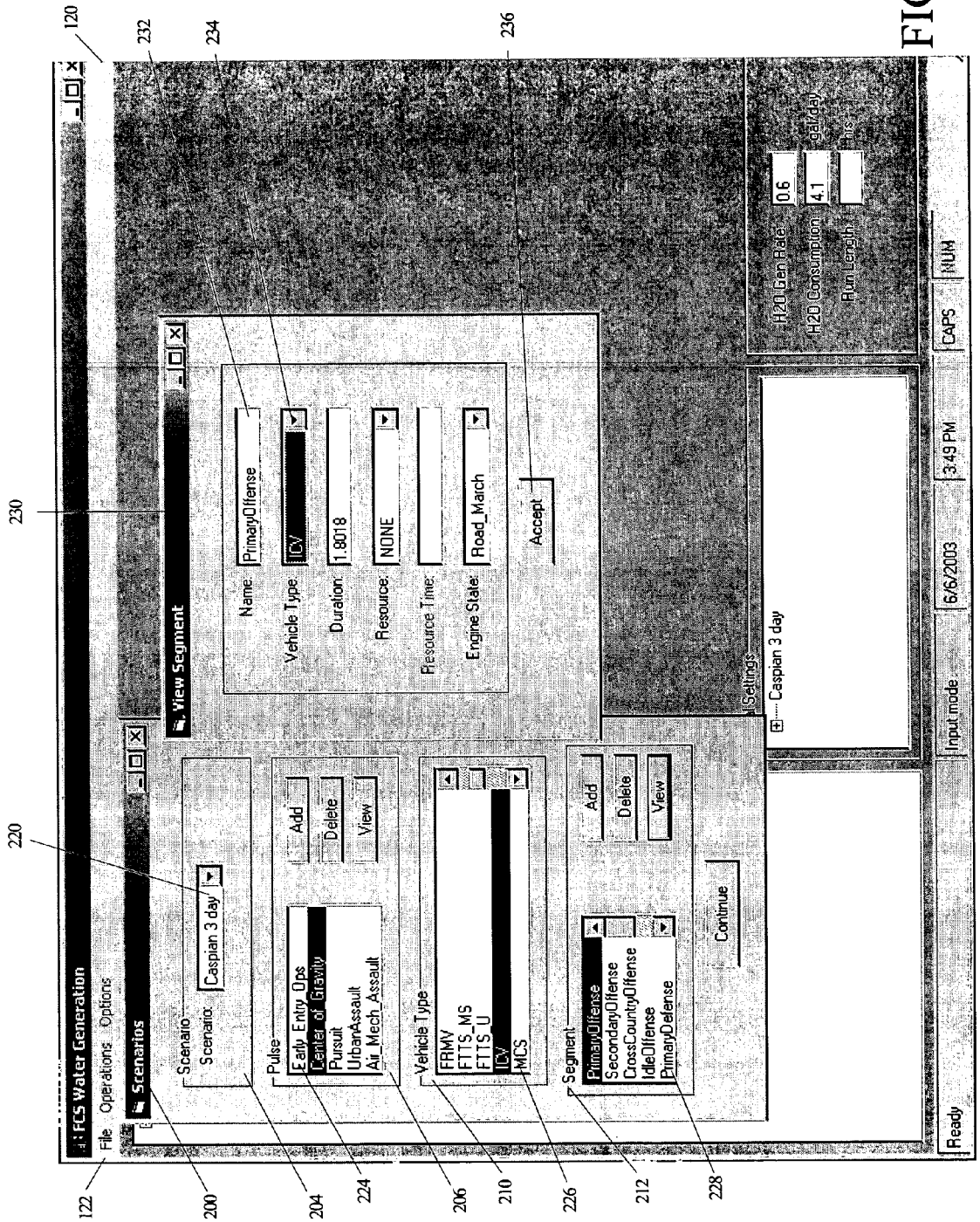

Referring now to FIG. 5, a scenarios window 200 is presented upon selection of an associated function within the pull-down menus 122 or by another activation method associated with the application program 120. The scenarios window 200 includes a scenario identifier section 204, a pulse section 206, a platform section 210, and a segment section 212. In this example, the scenario is titled Caspian 3-day, as identified in the scenario section 204. The scenarios window 200 allows the user to view various operational requirements of all the platforms at various stages of the scenario. The stages or pulses of the scenario and the operational requirements or segments of the pulse are all previously defined by an assessment of the logistic requirements of the operation that is to be simulated in this application program. The pulse section 206 includes a pulse window 224 that presents the pulses associated with the scenario. Adjacent to the pulse window 224 are an Add button that, when activated, allows the addition of a pulse, a Delete button that, when activated, allows deletion of a selected pulse, and a View button that, when activated, presents a window for viewing details of a pulse that is selected in the pulse window 224. The platform section 210 includes a platform window 226 that presents all the platforms that are associated with the pulse that is highlighted within the pulse window 224. The segment section 212 includes a segment window 228 that suitably presents in a scroll-down window all the segments associated with the platform highlighted or suitably distinguished in the platform window 226 as associated with the selected pulse. Adjacent to the segment window 228 are Add, Delete, and View buttons that allow addition, deletion, and viewing of a segment highlighted within the segment window 228, respectively. In this example, a user has highlighted the center of gravity pulse in the pulse window 224, the ICV platform in the platform window 226, and the primary offense segment in segment window 228.

Upon activation of the view button in the segment section 212, a view segment window 230 is presented. The view segment window 230 includes a segment name field 232 that identifies the segment name that is selected in the segment section 212. A platform type field 234 presents the selected platform from the platform section 210, but also allows the user to select any of the other platform types that are associated with the pulse that is selected in the pulse section 206. The view segment window 230 also includes other attributes, previously defined during logistics assessment, that are associated with or required in the primary offense segment. The view segment window 230 also includes an Accept button 236 that, when activated, accepts the attributes within the view segment window 230.

Figure 6:
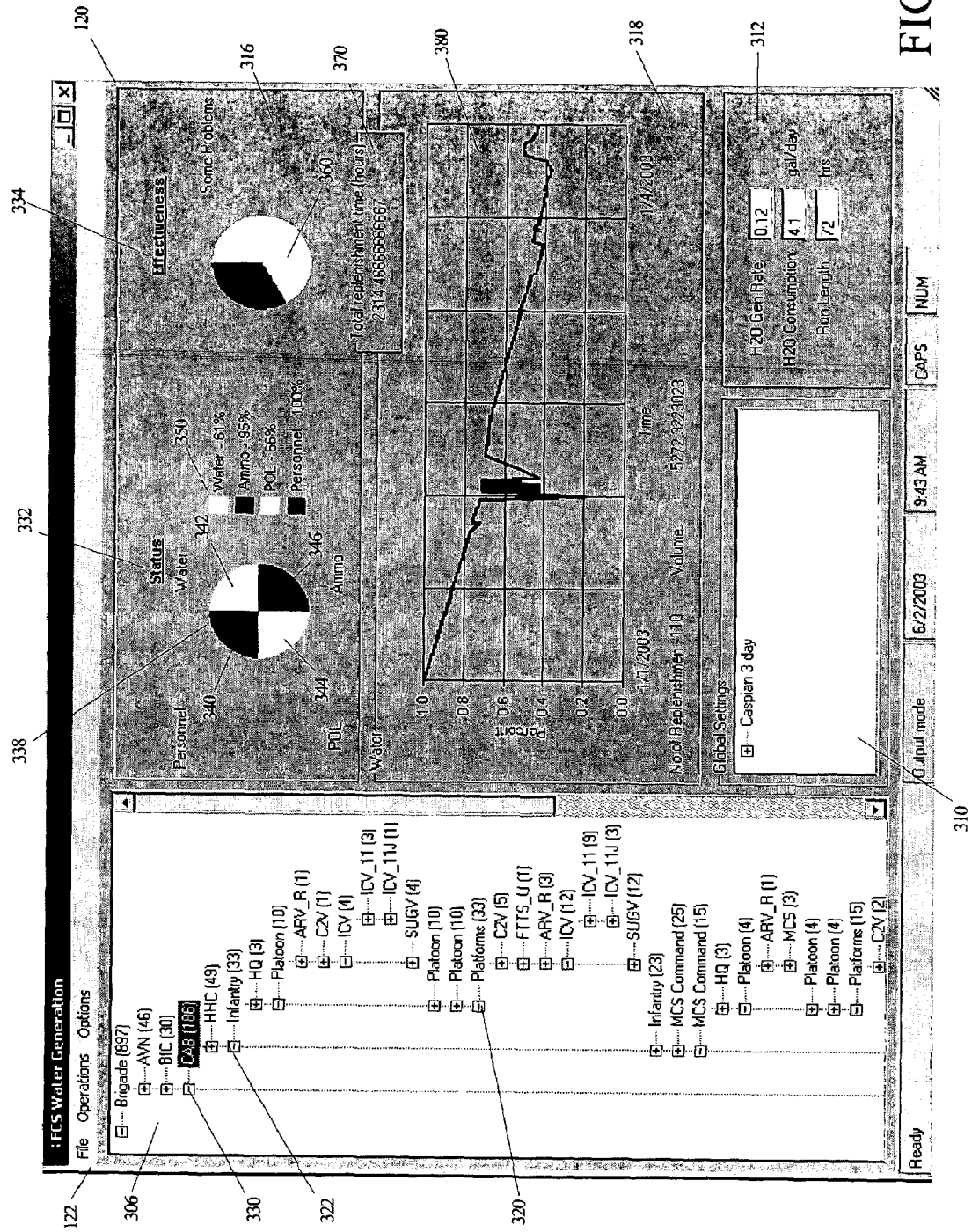

FIGS. 6-9 illustrate the windows-based application program 120 after the simulation has been run according to the scenario. Referring now to FIG. 6, the windows-based application program 120 presents a logistic structure section 306, a chart section 316, a graph section 318, a global settings identifier section 310, and a water consumption section 312. The logistics structure section 306 presents a directory structure of the model being simulated. In one embodiment the directory structure is presented in a similar manner as file folders are presented in Windows Explorer. In this example, a Brigade is the highest entity in the directory structure and all the entities below it are subcommands. The subcommands may or may not include even further subcommands and the associated platforms of those subcommands. The directory structure can be as complex as needed in order to properly portray the logistics model being simulated. For example, a Combined Arms Battalion (CAB) command 330 includes 186 platforms that all report to the Brigade. Not only is the data organized by what command each platform reports to and what (sub)commands the (sub)commands report to, but is also organized by just the platform types within a command. For example, Platforms 320 includes all 33 platforms of the Infantry command 322. The Infantry command 322 includes subcommands HQ and 3 Platoons. Each Platoon includes 10 platforms each and the HQ includes 3, thereby totaling 33 platforms. One can review the performance of each platform type in each individual subcommand or can review performance of all the platforms within the subcommand.

The chart section 316 includes a status area 332 and an effectiveness area 334. The status area 332 presents status of commodities associated with a highlighted item (command or platform(s)) from the logistics structure section 306 as it relates to all the platforms that are using those commodities within the selected item. The status of commodities is the status after running of the simulation with regards to the scenario. The status area 332 includes a circle chart 338 that is partitioned into quadrants for each commodity (Personnel 340, Water 342, POL (Petroleum, Oil, & Lubricants or fuel) 344, and Ammo (Ammunition) 346) and a status list 350 that presents the percentage of the commodities available at the end of the simulation. In this example, the CAB command 330 has been selected. The total results of all the commodities expended/used by all the platforms within the CAB command 330 are presented in the status list 350. The effectiveness area 334 includes a circle chart 360 with associated text that indicates whether any problems exist. Based on user-defined parameters, the effectiveness area 334 shows to what percentage of preparedness the platform or group of platforms is mission-worthy (by commodity) to begin another tasking or scenario. The effectiveness area 334 can be viewed from individual platform level or any grouping of platforms or level within the organizational tree.

The graph section 318 includes a commodity percentage versus time graph 380 of a commodity that has been selected by a user operating the input device 26 (FIG. 1) in the status section 316 or by another selection means. The commodity percentage versus time graph 380 spans the time of the simulation and illustrates percentage quantities of the associated commodity through the operational time of the scenario. With regards to this example, when a user has selected the Water 342 in the circle chart 338, water usage results are presented within the graph 380 in real-time or near real-time. Also presented within the graph section 318 is a total replenishment time 370 that indicates total amount of time over the model run (expressed in hours) that it took to re-supply all platforms represented in the model with water, fuel, and ammo. This particular view is a roll up of all platforms but can be viewed by platform type, or organizational structure as well.

The water consumption section 312 includes water generation rate consumption and run length. Run length is the identified operational time for the scenario. In this display, the water consumption section 312 is expressed on a post model run report document. The water consumption section 312 provides a convenient reminder of the input settings defined in the setup of the model for the commodities listed. There is a different screen for each of the commodities in the model.

The global setting identifier section 310 indicates the scenario in accordance with which simulation is run.

In this embodiment, the color of the items within the chart section 316 is indicative of the status shown in the status list 350. When the percentage value of the commodity is within a certain range, then a certain color is presented adjacent to the commodity within the commodity list 350 and within the respective quadrant of the circle chart 338. The effectiveness circle chart 360 also presents distinct colors when the effectiveness drops below a threshold value.

Figure 7:
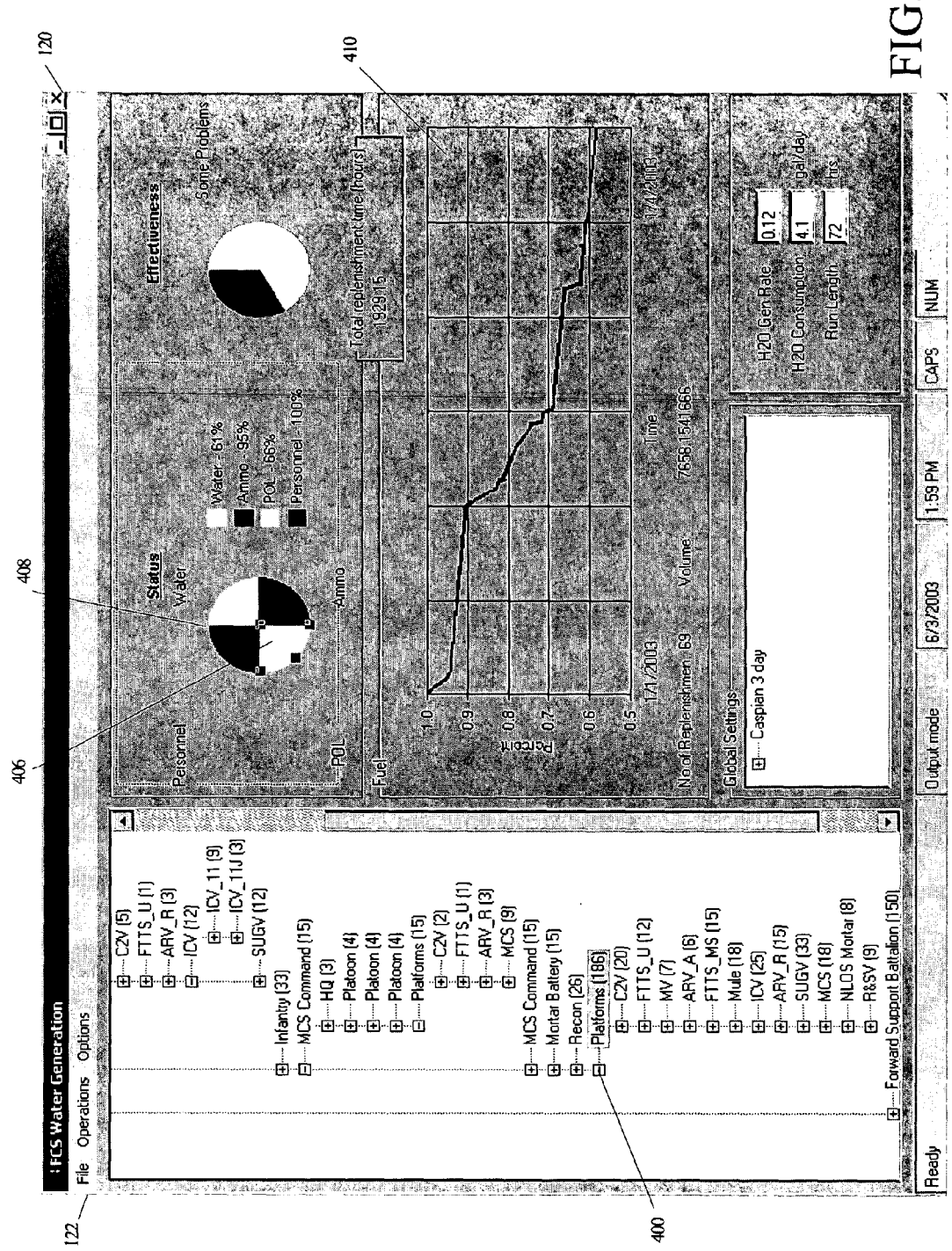

FIG. 7 illustrates the windows-based application program 120 with a Platforms 400 selected from the logistic structure section 306. In addition, the user has selected the POL 406 from a circle chart 408, thereby causing presentation of, in this example, fuel percentage usage over time in a time graph 410. The fuel usage indicates fuel usage of all the platforms included within the selected Platforms 400. The Platforms 400 identifies all the platforms under the CAB command 330 (FIG. 6). The time graph 410 illustrates fuel consumption over the run time of the simulation in the scenario. Also the effectiveness area 334 indicates any problems associated with fuel usage for all of the platforms associated with the Platform 400—all 186 platforms.

Figure 8:
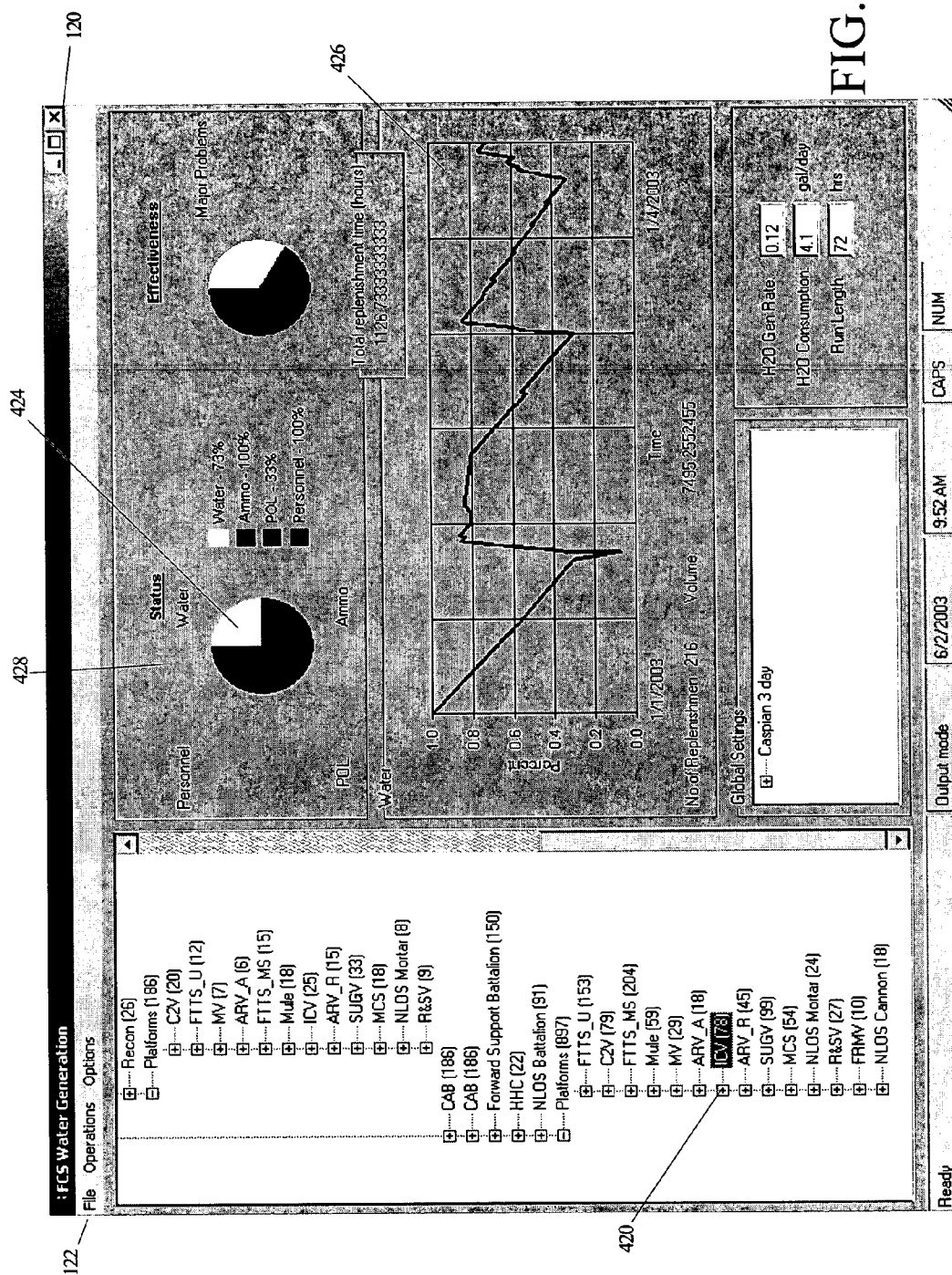

Referring now to FIG. 8, the user has selected an Infantry Combat Vehicle (ICV) 420 from the directory structure. The ICV 420 includes all the ICVs of the Brigade. In other words, the user desires to see information that relates to all the ICVs of the Brigade. Upon selection of the Water 424 in the status area 428, water consumption and replenishment over time are illustrated in a commodities usage versus time graph 426.

Figure 9:
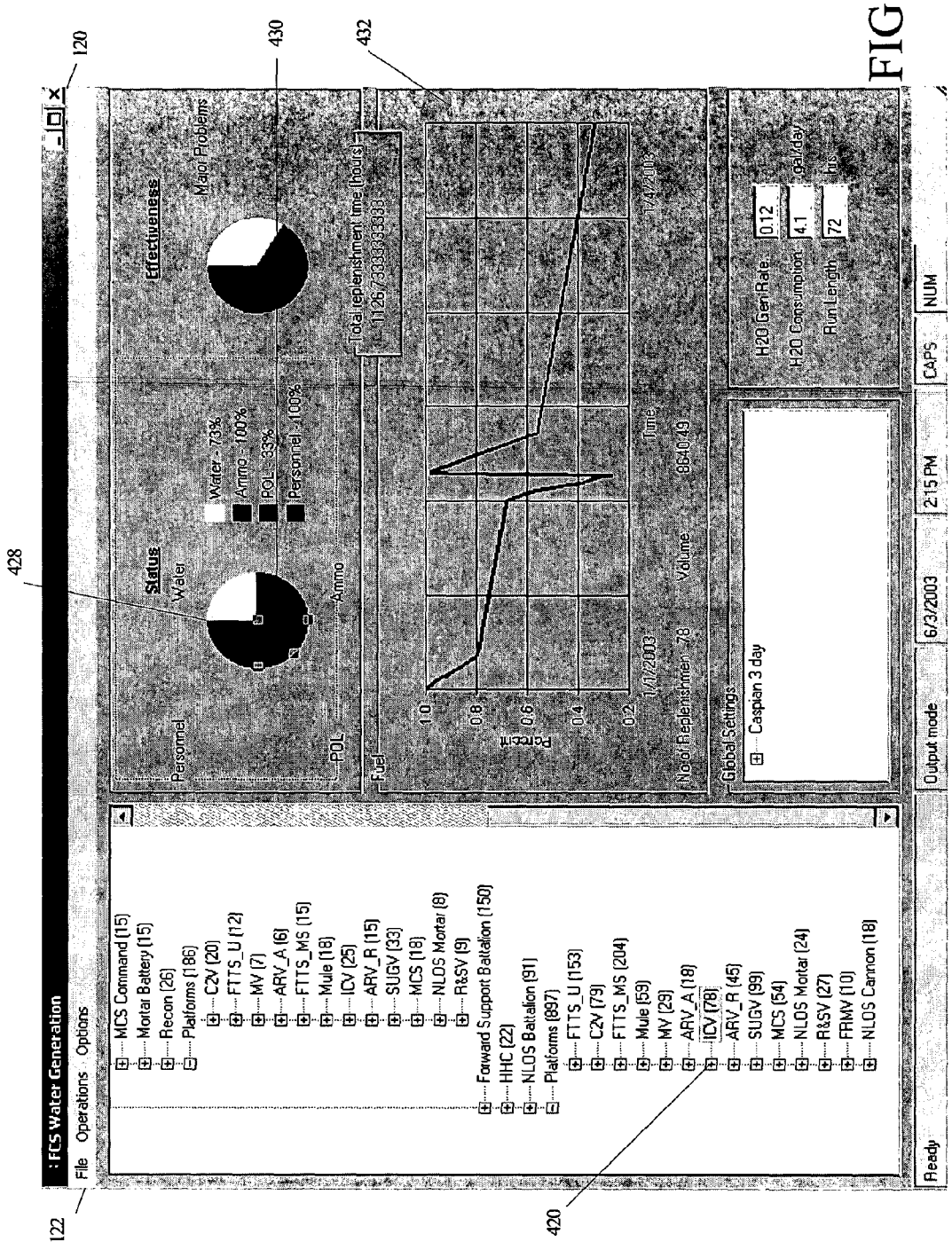

Referring now to FIG. 9, the user has selected the POL 430 from the status area 428, thereby presenting fuel consumption and replenishment over time for all the ICVs of the Brigade.

Therefore, after running the simulation for a particular scenario, the user can view and analyze commodity consumption of virtually any platform or group of platforms by themselves or within any of the commands or subcommands. It will also be appreciated that the directory structure of the original simulation model can be manipulated and then re-run for the same scenario in order to assess different aspects or changes made to a simulation model.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A computer readable media storing computer readable instructions that, when executed by a computer processor, provide a graphical user interface input device for creating and editing a simulation model, the device comprising:
   a first component configured to enter and edit transportation platforms and associated attributes, wherein the transportation platforms have been determined to be included within the simulation model;
   a second component configured to enter and edit commodities, wherein commodities are one or more of water, personnel, POL and ammo; and
   a third component configured to perform one of assigning or removing a commodity to or from a transportation platform.

2. The computer readable media of claim 1, further comprising a fourth component configured to create and edit a scenario.

3. The computer readable media of claim 2, wherein the fourth component further comprises a fifth component configured to add a pulse to the scenario.

4. The computer readable media of claim 3, wherein the fourth component further comprises a sixth component configured to delete a pulse from the scenario.

5. The computer readable media of claim 4, wherein the fourth component further comprises a seventh component configured to view details of a pulse associated with the scenario.

6. The computer readable media of claim 3, wherein the fourth component includes a sixth component configured to add a transportation platform to a pulse.

7. The computer readable media of claim 3, wherein the fourth component includes a sixth component configured to delete a transportation platform from a pulse.

8. The computer readable media of claim 3, wherein the fourth component further includes a sixth component configured to add a segment to a pulse.

9. The computer readable media of claim 8, wherein the fourth component further includes a seventh component configured to delete a segment from a pulse.

10. The computer readable media of claim 9, wherein the fourth component further includes an eighth component configured to view details of a segment.

11. The computer readable media of claim 8, wherein the first component is further configured to perform one of define or edit attributes of a transportation platform based on at least one of a segment or a pulse.

12. The computer readable media of claim 1, wherein the simulation model is created using a simulation reference modeling language.

13. A computer readable media containing computer readable instructions that, when executed by a computer processor, provide a graphical user interface output device for presenting a directory structure for a logistics model, the directory structure comprising:
   a plurality of organizational units, wherein each organizational unit is organized by the command organization to which each organizational unit reports; and
   one or more transportation platform directory structures, wherein each transportation platform is organized by the organizational unit that each transportation platform reports.

14. The computer readable media of claim 13, further comprising a commodities output area configured to present commodity usage information.

15. The computer readable media of claim 14, wherein the commodities output area includes a commodities usage list configured to present commodity usage information of one of a transportation platform, group of transportation platforms, or organizational unit selected in the directory structure.

16. The computer readable media of claim 15, wherein the commodities output area includes a component configured to present effectiveness information.

17. The computer readable media of claim 16, wherein the commodities output area further includes a graph for presenting commodity usage over time based on one of the selected operational unit, transportation platform, or group of transportation platforms from the directory structure and a commodity selected from the commodities output area.

18. The computer readable media of claim 17, wherein the commodities output area includes a color component configured to display a color patch adjacent to commodity usage information, wherein the color component presents a color based on commodity usage in the simulation model.

19. A computer readable media containing computer readable instructions that, when executed by a computer processor, provide a graphical user interface device for creating and editing a simulation model and presenting the simulation model run within a scenario, the device comprising:
 a first component configured to enter and edit transportation platforms and associated attributes, wherein the transportation platforms have been determined to be included within the simulation model;
 a second component configured to enter and edit commodities;
 a third component configured to perform one of assigning or removing a commodity to or from a transportation platform; and
 a directory structure including:
 a plurality of organizational units, wherein each organizational unit is organized by the command organization to which each organizational unit reports; and
 one or more transportation platform directory structures, wherein each transportation platform is organized by the organizational unit that each transportation platform reports to.

20. The computer readable media of claim 19, further comprising a fourth component configured to create and edit a scenario.

21. The computer readable media of claim 20, wherein the fourth component further comprises a fifth component configured to add a pulse to the scenario.

22. The computer readable media of claim 21, wherein the fourth component further comprises a sixth component configured to delete a pulse from the scenario.

23. The computer readable media of claim 22, wherein the fourth component further comprises a seventh component configured to view details of a pulse associated with the scenario.

24. The computer readable media of claim 21, wherein the fourth component includes a sixth component configured to add a transportation platform to a pulse.

25. The computer readable media of claim 21, wherein the fourth component includes a sixth component configured to delete a transportation platform from a pulse.

26. The computer readable media of claim 21, wherein the fourth component further includes a sixth component configured to add a segment to a pulse.

27. The computer readable media of claim 26, wherein the fourth component further includes a seventh component configured to delete a segment from a pulse.

28. The computer readable media of claim 27, wherein the fourth component further includes an eighth component configured to view details of a segment.

29. The computer readable media of claim 26, wherein the first component is further configured to perform one of define or edit attributes of a transportation platform based on at least one of a segment or a pulse.

30. The computer readable media of claim 19, further comprising a commodities output area configured to present commodity usage information.

31. The computer readable media of claim 30, wherein the commodities output area includes a commodities usage list configured to present the commodity usage information of one of a transportation platform, group of transportation platforms, or organizational unit selected in the directory structure.

32. The computer readable media of claim 31, wherein the commodities output area includes a component configured to present effectiveness information.

33. The computer readable media of claim 32, wherein the commodities output area further includes a graph for presenting commodity usage over time based on one or the selected operational unit, transportation platform, or group of transportation platforms from the directory structure and a commodity selected from the commodities output area.

34. The computer readable media of claim 33, wherein the commodities output area includes a color component configured to display a color patch adjacent to commodity usage information, wherein the color component presents a color based an commodity usage in the simulation model.

35. The computer readable media of claim 19, wherein the simulation model is created using a simulation reference modeling language.

36. A method for presenting a logistics model for a simulated warfare operation, the method comprising:
 presenting a directory structure comprising:
 a plurality of organizational units, wherein each organizational unit is organized by the command organization to which the organizational unit reports to; and
 one or more transportation platform directory structures, wherein each transportation platform is organized by the organizational unit that each transportation platform reports.

37. The method of claim 36, further comprising presenting commodity usage information.

38. The method of claim 37, wherein presenting commodity usage information includes presenting commodity usage information of one of a transportation platform, group of transportation platforms, or organizational unit selected in the directory structure.

39. The method of claim 38, wherein presenting commodity usage information includes presenting effectiveness information.

40. The method of claim 39, wherein presenting commodity usage information includes presenting commodity usage over time based on one of the selected operational unit, transportation platform, or group of transportation platforms from the directory structure and a commodity selected from the commodities output area.

41. The method of claim 40, wherein presenting commodity usage information includes displaying a color patch adjacent to commodity usage information based on commodity usage in the simulation model.

42. A computer system comprising:
 a processor for executing a logistics model for a simulated warfare operation;
 a display device coupled to the processor, the display device configured to display a directory structure comprising:
 a plurality of organizational units, wherein each organizational unit is organized by the command organization to which each organizational unit reports; and one or more transportation platform directory structures, wherein each transportation platform is organized by the organizational unit that each transportation platform reports to.

43. The system of claim 42, wherein the display device is further configured to display a commodities output area configured to present commodity usage information.

44. The system of claim 43, wherein the commodities output area includes a commodities usage list configured to present commodity usage information of one of a transportation platform, group of transportation platforms, or organizational unit selected in the directory structure.

45. The system of claim 44, wherein the commodities output area includes a component configured to present effectiveness information.

46. The system of claim 45, wherein the commodities output area further includes a graph for presenting commodity usage over time based on one of the selected operational unit, transportation platform, or group of transportation platforms from the directory structure and a commodity selected from the commodities output area.

47. The system of claim 46, wherein the commodities output area includes a color component configured to display a color patch adjacent to commodity usage information, wherein the color component presents a color based on commodity usage in the simulation model.

48. The system of claim 42, wherein the simulation model is created using a simulation reference modeling language.

* * * * *